US010515797B2

(12) United States Patent
Furumoto et al.

(10) Patent No.: US 10,515,797 B2
(45) Date of Patent: Dec. 24, 2019

(54) METHOD FOR PRODUCING SEMICONDUCTOR DEVICE

(71) Applicant: TOSHIBA MEMORY CORPORATION, Minato-ku, Tokyo (JP)

(72) Inventors: Kazuhito Furumoto, Yokkaichi Mie (JP); Keisuke Kikutani, Yokkaichi Mie (JP); Soichi Yamazaki, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/031,535

(22) Filed: Jul. 10, 2018

(65) Prior Publication Data
US 2019/0259609 A1 Aug. 22, 2019

(30) Foreign Application Priority Data

Feb. 19, 2018 (JP) .................. 2018-027170

(51) Int. Cl.
H01L 21/02 (2006.01)
H01L 27/11563 (2017.01)
H01L 21/302 (2006.01)
H01L 21/033 (2006.01)
H01L 21/28 (2006.01)

(52) U.S. Cl.
CPC .... *H01L 21/02532* (2013.01); *H01L 21/0332* (2013.01); *H01L 21/28079* (2013.01); *H01L 21/302* (2013.01); *H01L 27/11563* (2013.01)

(58) Field of Classification Search
CPC .......... H01L 21/02532; H01L 21/0332; H01L 21/28079; H01L 21/302; H01L 27/11563
See application file for complete search history.

(56) References Cited

U.S. PATENT DOCUMENTS

| 6,953,746 | B2 | 10/2005 | Uesawa |
| 8,426,976 | B2 | 4/2013 | Ishiduki et al. |
| 2016/0071957 | A1 | 3/2016 | Oshiki et al. |
| 2019/0043723 | A1* | 2/2019 | Zhou .................. H01L 21/6831 |

* cited by examiner

*Primary Examiner* — Karen Kusumakar
(74) *Attorney, Agent, or Firm* — Foley & Lardner LLP

(57) ABSTRACT

According to one embodiment, a method for producing a semiconductor device includes forming a first film on a substrate. A second film is formed on the first film. A recess is formed in the second film. First processing by which a third film is formed on the second film to form a side face of the recess with the second film and second processing by which the first film exposed in the recess is processed by using the second and third films, are executed one or more times. In relation to an N-th (N is an integer greater than or equal to 1) first processing, before the third film is formed on the second film, a surface inclined with respect to the side face of the recess is formed above the side face of the recess.

15 Claims, 6 Drawing Sheets

Prior Art

METHOD FOR PRODUCING SEMICONDUCTOR DEVICE

CROSS-REFERENCE TO RELATED APPLICATIONS

This application claims the benefit of and priority to Japanese Patent Application No. 2018-027170, filed Feb. 19, 2018, the entire contents of which are incorporated herein by reference.

FIELD

Embodiments described herein relate generally to methods for producing a semiconductor device.

BACKGROUND

When a semiconductor device such as a three-dimensional memory is produced, a metal mask layer is sometimes used to form a hole with a high aspect ratio. In this case, the formation of the metal mask layer is difficult.

DETAILED DESCRIPTION

Embodiments provide a method for producing a semiconductor device, the method that can easily form a suitable mask layer.

In general, according to one embodiment, a method for producing a semiconductor device may include forming a first film on a substrate. Moreover, the method may include forming a second film on the first film. Furthermore, the method may include forming a recess in the second film. In addition, the method may include executing, one or more times, first processing by which a third film is formed on the second film in such a way as to form a side face of the recess with the second film and second processing by which the first film exposed in the recess is processed by using the second and third films. In the N-th (N is an integer greater than or equal to 1) first processing, before the third film is formed on the second film, by processing the recess formed by the time the N-th first processing is executed, a surface inclined with respect to the side face of the recess may be formed above the side face of the recess.

Hereinafter, embodiments will be described with reference to the drawings.

First Embodiment

FIG. 1A to FIG. 3C are sectional views depicting a method for producing a semiconductor device according to a first embodiment. The semiconductor device of the first embodiment may be a three-dimensional memory, for example.

Figure 1A:
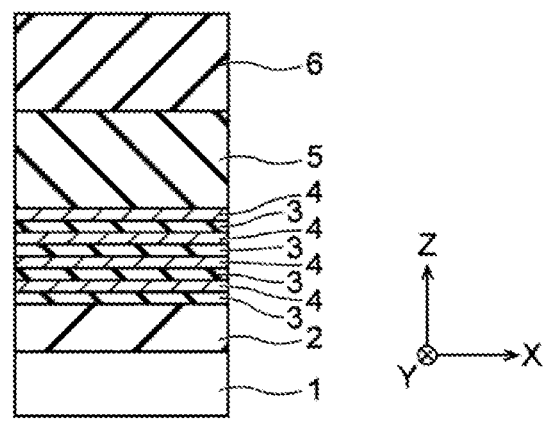
FIG. 1A to FIG. 1C are sectional views (1/3) depicting a method for producing a semiconductor device according to a first embodiment.

First, referring to FIG. 1A, a foundation layer 2 is formed on a substrate 1, and a plurality of insulating layers 3 and a plurality of electrode layers 4 are alternately formed on the foundation layer 2. The foundation layer 2, the insulating layers 3, and the electrode layers 4 are examples of a first film. Next, on the stacked film including these insulating layers 3 and electrode layers 4, a foundation mask layer 5 is formed, and, on the foundation mask layer 5, a photoresist layer 6 is formed (see FIG. 1A). The foundation mask layer 5 is an example of a second film.

The substrate 1 is, for example, a semiconductor substrate such as a silicon (Si) substrate. FIG. 1A shows an X direction and a Y direction which are parallel to the front surface of the substrate 1 and perpendicular to each other and a Z direction which is perpendicular to the front surface of the substrate 1. In the present disclosure, a +Z direction is treated as an upper direction and a −Z direction is treated as a lower direction; however, it does not matter whether the −Z direction coincides or does not coincide with the direction of gravity.

The foundation layer 2 is, for example, an interlayer dielectric such as a silicon dioxide ($SiO_2$) film or a silicon nitride (SiN) film. The foundation layer 2 may include a semiconductor layer or a conductor layer. In some embodiments, the insulating layers 3 and the electrode layers 4 are directly formed on the substrate 1, and the foundation layer 2 is not necessary.

The insulating layer 3 is a $SiO_2$ film, for example. The electrode layer 4 is, for example, a tungsten (W) film. Tungsten in the electrode layer 4 is an example of a second metallic element. The electrode layer 4 according to the first embodiment may function as a control electrode (e.g., a word line) of the three-dimensional memory. A combination of the materials of the insulating layer 3 and the electrode layer 4 may be a combination other than "$SiO_2$ and W"; for instance, the combination may be "SiN and W", "$SiO_2$ and molybdenum (Mo)", "SiN and Mo", "$SiO_2$ and Si", or "SiN and Si.".

The foundation mask layer 5 according to the first embodiment may be a nonmetal mask layer that does not contain a metallic element and is a $SiO_2$ film, for instance. The photoresist layer 6 according to the first embodiment may be formed on the foundation mask layer 5 with a carbon film (not shown) and an antireflection film (not shown) placed between the foundation mask layer 5 and the photoresist layer 6.

Figure 1B:
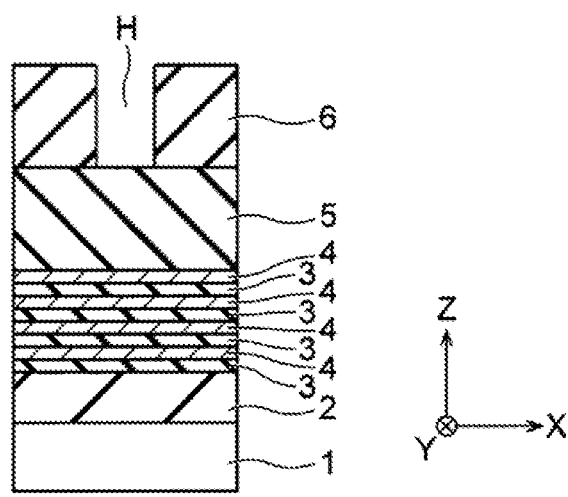
Figure 1C:
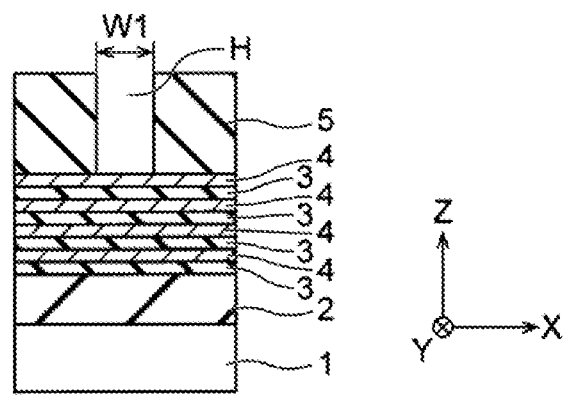

Next, a hole H is formed in the photoresist layer 6 by lithography (FIG. 1B). The hole H is an example of a recess. Next, by reactive ion etching (RIE), for example, using the photoresist layer 6 as a mask, the antireflection film, the carbon film, and the foundation mask layer 5 on the bottom of the hole H are processed (FIG. 1C). As a result, the hole H is formed in (i.e., penetrates) the foundation mask layer 5. Then, the photoresist layer 6, the antireflection film, and the carbon film may be removed by using $O_2$ plasma or the like.

A reference sign W1 denotes an opening width (i.e., the upper end diameter) of the hole H of the foundation mask layer 5 after the process of FIG. 1C. In the first embodiment, the hole H may be formed in the foundation mask layer 5 in such a way that the thickness of the foundation mask layer 5 (e.g., in the X direction in FIG. C) is three or more times larger than the opening width W1 of the hole H. In some embodiments, the opening width W1 refers to, for example, the maximum diameter of the hole H; however, the opening width W1 is not limited thereto if the recess is a recess other than the hole H. For example, if the recess is a groove extending in the Y direction, the opening width W1 may be, for instance, the length of the groove on the X-axis.

In the first embodiment, then, first processing by which a metal mask layer is formed on the foundation mask layer 5 and second processing by which the plurality of electrode layers 4, the plurality of insulating layers 3, and the foundation layer 2 which are exposed in the hole H are processed are executed one or more times (FIG. 2A to FIG. 3C). Specifically, the first processing and the second processing may be alternately and repeatedly executed until the hole H passes through these electrode layers 4, insulating layers 3, and foundation layer 2 and reaches the substrate 1. The metal mask layer may be a single metal layer such as an aluminum (Al) film or a metallic compound layer such as an aluminum oxide ($Al_2O_3$) film or an yttrium oxide ($Y_2O_3$) film.

Figure 2A:
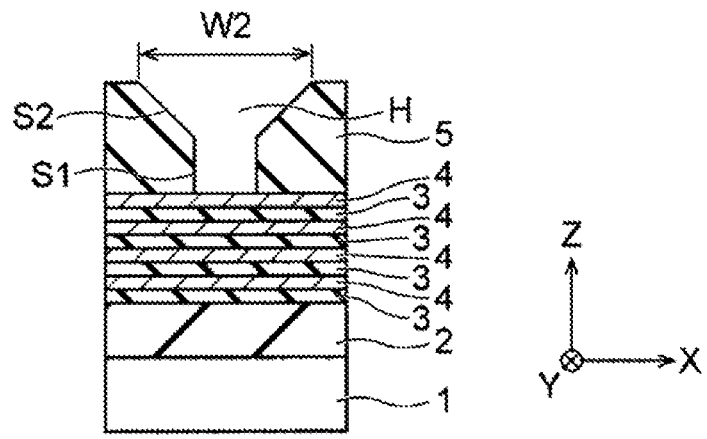
FIG. 2A to FIG. 2C are sectional views (2/3) depicting the method for producing a semiconductor device according to the first embodiment.
Figure 2B:
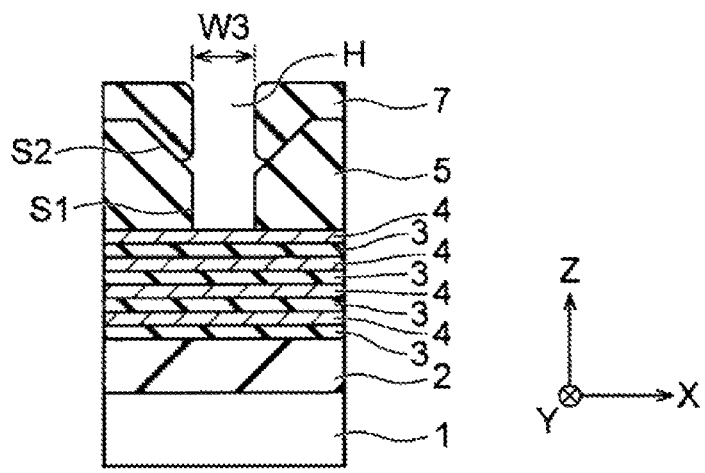
Figure 2C:
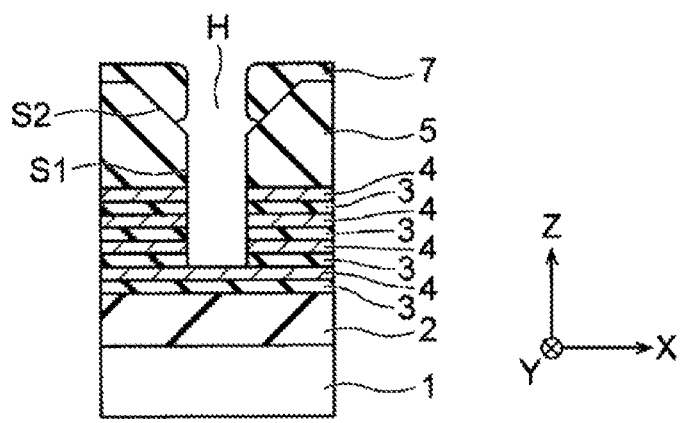

Processes of FIG. 2A and FIG. 2B correspond to the 1st first processing, and a process of FIG. 2C corresponds to the 1st second processing. Processes of FIG. 3A and FIG. 3B correspond to the 2nd first processing, and a process of FIG. 3C corresponds to the 2nd second processing. Hereinafter, the details of the first processing and the second processing will be described.

First, referring to FIG. 2A, by processing the hole H formed by the time the process of FIG. 2A is executed, an inclined surface S2 inclined with respect to a side face S1 of the hole H is formed above the side face S1 of the hole H. The formation of the inclined surface S2 may be performed by dry etching using argon (Ar) plasma, for example. The formation of the inclined surface S2 may be performed by using another plasma. By this process, the inclined surface S2 of the foundation mask layer 5 is formed between the side face S1 of the foundation mask layer 5 and the upper surface of the foundation mask layer 5. The angle of inclination of the inclined surface S2 with respect to the X-Y plane may be 45 to 85 degrees, for example. A reference sign W2 denotes an opening width of the hole H of the foundation mask layer 5 after the process of FIG. 2A.

Next, referring to FIG. 2B, on the foundation mask layer 5, a metal mask layer 7 is formed in such a way as to form the side face S1 of the hole H with the foundation mask layer 5. The metal mask layer 7 may be a mask layer containing a metallic element and is an $Al_2O_3$ film, for example. The metal mask layer 7 is an example of a third film, and aluminum in the metal mask layer 7 is an example of a first metallic element. If the metal mask layer 7 is a $Y_2O_3$ film, yttrium in the metal mask layer 7 is an example of the first metallic element, and, if the metal mask layer 7 is an Al film, aluminum in the metal mask layer 7 is an example of the first metallic element (and so on).

The metal mask layer 7 according to the first embodiment may be formed by physical vapor deposition (PVD).

As a result, the metal mask layer 7 can be formed in a non-conformal manner and accordingly can be selectively formed on the upper surface and the inclined surface S2 of the foundation mask layer 5. According to the first embodiment, by forming the metal mask layer 7 by PVD, the chances of the metal mask layer 7 being formed on the side face S1 of the foundation mask layer 5 can be made close to zero. The metal mask layer 7 may be formed by other methods that can form the metal mask layer 7 in a non-conformal manner; for example, the metal mask layer 7 may be formed by chemical vapor deposition (CVD).

Moreover, according to the first embodiment, by setting the aspect ratio of the hole H of the foundation mask layer 5 at a large value, the chances of the metal mask layer 7 being formed on the bottom face of the hole H can be made close to zero. For this reason, in the first embodiment, the thickness of the foundation mask layer 5 (for example, in the X direction in FIG. 2A to FIG. 2C) may be set so as to be three or more times larger than the above-described opening width W1. As a result, a situation in which the metal mask layer 7 on the bottom face of the hole H hampers the processing of the electrode layers 4, the insulating layers 3, and the foundation layer 2 can be avoided.

A reference sign W3 denotes an opening width of the hole H of the foundation mask layer 5 and the metal mask layer 7 after the process of FIG. 2B. According to the first embodiment, by forming the metal mask layer 7 after forming the inclined surface S2 in the foundation mask layer 5, the metal mask layer 7 can be formed to prevent blockage of the hole H. The metal mask layer 7 of the first embodiment may be formed such that the opening width W3 has approximately the same value as the above-described opening width W1. That is, the opening width W3 and the opening width W1 do not need to completely coincide with each other and may be approximately the same value. In the first embodiment, in order to prevent blockage of the hole H effectively, the opening width W2 (see FIG. 2A) may be set at a value which is sufficiently larger than the value of the opening width W1.

Next, referring to FIG. 2C, the electrode layers 4 and the insulating layers 3 on the bottom of the hole H may be processed by RIE using the metal mask layer 7 and the foundation mask layer 5 as a mask. As a result, the hole H can pass through some electrode layers 4 and insulating layers 3. At this time, the thickness of the metal mask layer 7 may decrease under the influence of RIE.

The 1st first processing and second processing are executed in this manner. In the first embodiment, before the hole H reaches the substrate 1, the metal mask layer 7 becomes thin in the X direction (see FIG. 2C). Thus, the 2nd first processing and second processing are then started.

Figure 3A:
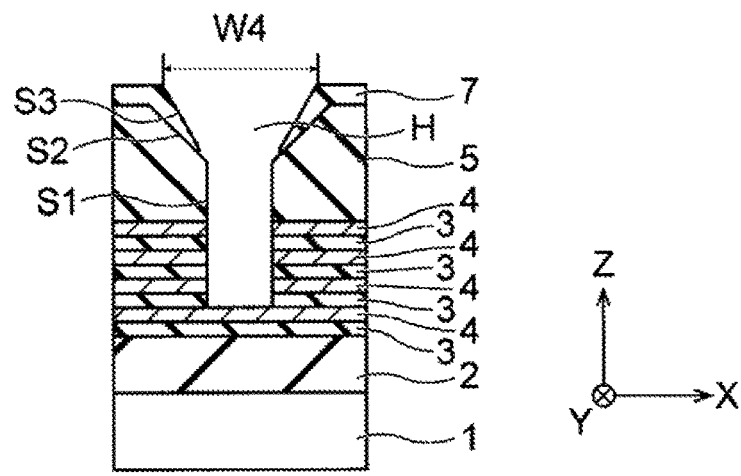
FIG. 3A to FIG. 3C are sectional views (3/3) depicting the method for producing a semiconductor device according to the first embodiment.

First, referring to FIG. 3A, by processing the hole H formed by the time the process of FIG. 3A is executed, an inclined surface S3 inclined with respect to the side face S1 of the hole H is formed above the side face S1 of the hole H. This process can be executed in a manner similar to the process of FIG. 2A. By this process, the inclined surface S3 of the metal mask layer 7 is formed between the side face S1 of the hole (e.g., a side face of the metal mask layer 7 and the foundation mask layer 5) and the upper surface of the metal mask layer 7.

The process of FIG. 3A may be started after any one of the upper surface and the inclined surface S2 of the foundation mask layer 5 or both are exposed in the process of FIG. 2C. In that case, the inclined surface S3 may be formed in the foundation mask layer 5 or may be formed over the foundation mask layer 5 and the metal mask layer 7. The same goes for the execution of the 3rd and subsequent first processing. A reference sign W4 denotes an opening width of the hole H of the foundation mask layer 5 and the metal mask layer 7 after the process of FIG. 3A.

Figure 3B:
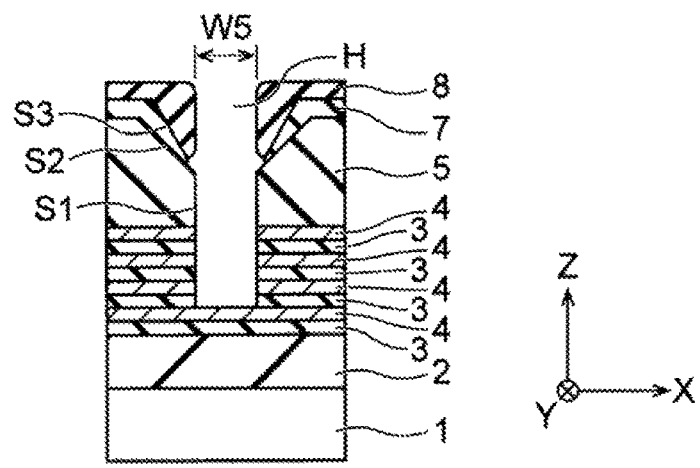

Next, referring to FIG. 3B, on the metal mask layer 7, a metal mask layer 8 is formed in such a way as to form the side face S1 of the hole H with the foundation mask layer 5 and the metal mask layer 7. This process can be executed in a manner similar to the process of FIG. 2B. The metal mask layer 8 may be a mask layer containing a metallic element and is an $Al_2O_3$ film, for example. The metal mask layer 8 is an example of the third film, and aluminum in the metal mask layer 8 is an example of the first metallic element. The metal mask layer 8 according to the first embodiment may be formed by PVD in a non-conformal manner. As in the case of the metal mask layer 7, the metal mask layer 8 maybe a $Y_2O_3$ film or an Al film.

A reference sign W5 denotes an opening width of the hole H of the foundation mask layer 5, the metal mask layer 7, and the metal mask layer 8 after the process of FIG. 3B. According to the first embodiment, by forming the metal mask layer 8 after forming the inclined surface S3 in any one of the metal mask layer 7 and the foundation mask layer 5 or both, the metal mask layer 8 can be formed to prevent blockage of the hole H. The metal mask layer 8 according to the first embodiment is formed such that the opening width W5 has approximately the same value as the above-described opening width W1.

Figure 3C:
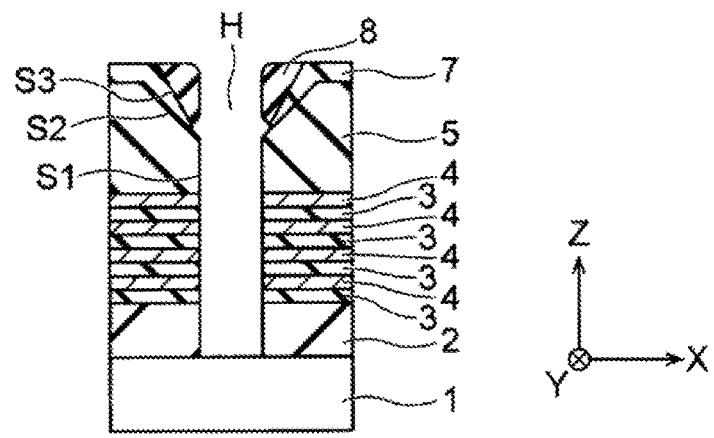

Next, referring to FIG. 3C, the electrode layers 4, the insulating layers 3, and the foundation layer 2 on the bottom of the hole H are processed by RIE using the metal mask layer 8, the metal mask layer 7, and the foundation mask layer 5 as a mask. As a result, the hole H can pass through these electrode layers 4, insulating layers 3, and foundation layer 2 and reaches the substrate 1. At this time, the thickness of the metal mask layer 8 may decrease under the influence of RIE.

In this way, the hole H passing through the electrode layers 4, the insulating layers 3, and the foundation layer 2 can be formed. This hole H can be used as a memory hole for the three-dimensional memory, for example.

In the first embodiment, in place of forming the stacked film alternately including the plurality of insulating layers 3 and the plurality of electrode layers 4, a stacked film alternately including a plurality of first insulating layers (e.g., insulating layers 3) and a plurality of second insulating layers (e.g., sacrificial layers—not shown) may be formed. The first insulating layer may be a $SiO_2$ film, for instance. The second insulating layer may be a SiN film, for instance. In this case, as the metal mask layers 7 and 8, a tungsten (W) film, for example, can be used. Each second insulating layer may be removed by etching after the process of FIG. 3C, and the electrode layer 4 may be embedded in a cavity formed by the removal of each second insulating layer.

Figure 4A:
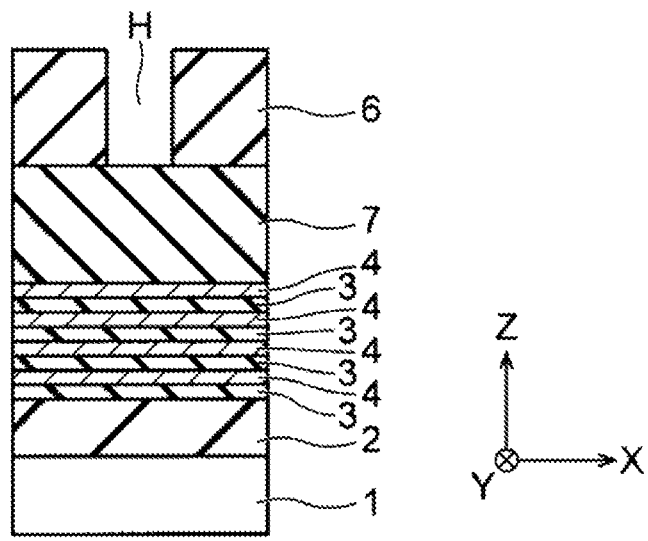
FIG. 4A and FIG. 4B are sectional views depicting a method for producing a semiconductor device according to a comparative example.
Figure 4B:
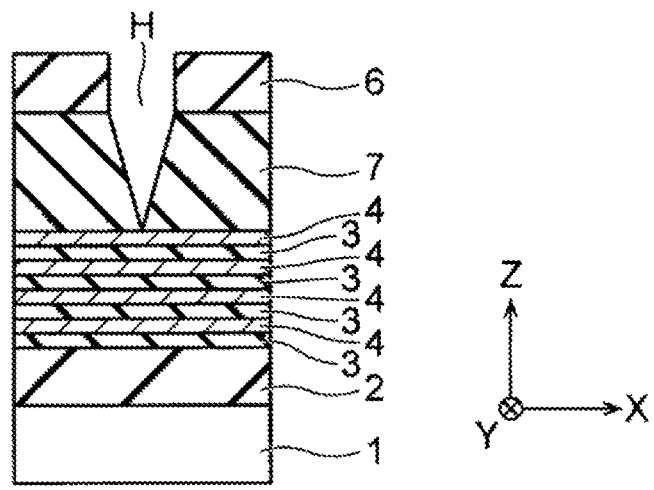

FIGS. 4A and 4B are sectional views depicting a method for producing a semiconductor device according to a comparative example.

Although FIG. 4A illustrates a structure similar to the structure of FIG. 1B, the foundation mask layer 5 of FIG. 1B is replaced with the metal mask layer 7. The metal mask layer 7 cannot be easily processed by etching compared to the nonmetal mask layer such as the foundation mask layer 5 described above.

Therefore, when an attempt to form the hole H penetrating the photoresist layer 6 to expose a surface of the metal mask layer 7 by RIE is made, there is a possibility that the side face of the hole H of the metal mask layer 7 has a taper shape or the hole H does not pass through the metal mask layer 7 (see FIG. 4B). On the other hand, to address these problems, if the film thickness of the metal mask layer 7 is reduced, there is a possibility that the metal mask layer 7 disappears before the completion of processing of the electrode layers 4, the insulating layers 3, and the foundation layer 2.

Thus, in the processes of FIG. 2A to FIG. 2C according to the first embodiment, the metal mask layer 7 is formed on the foundation mask layer 5 in a non-conformal manner and the electrode layers 4, the insulating layers 3, and the foundation layer 2 are processed by using the foundation mask layer 5 and the metal mask layer 7. As a result, there is no need to form the hole H in the metal mask layer 7 by etching and therefore the problem illustrated in FIG. 4B can be avoided. By contrast, the hole H can be easily formed in the foundation mask layer 5 (see FIG. 1C). The above descriptions apply to the processes of FIG. 3A to FIG. 3C too.

Furthermore, in the first embodiment, by forming the metal mask layer 7 after forming the inclined surface S2 in the foundation mask layer 5, blockage of the hole H by the metal mask layer 7 can be prevented. Moreover, in the first embodiment, an additional metal mask layer 8 can be formed when the metal mask layer 7 is about to disappear; therefore, the film thickness of the metal mask layer 7 can be reduced. This can also prevent blockage of the hole H. In addition, the metal mask layer 7 having a small film thickness can be formed more easily in a shorter amount of time than the metal mask layer 7 having a large film thickness. The above descriptions apply to the metal mask layer 8 too.

As described above, in the first embodiment, by executing, one or more times, the first processing by which the metal mask layer is formed on the foundation mask layer 5 and the second processing by which the plurality of electrode layers 4, the plurality of insulating layers 3, and the foundation layer 2 on the bottom of the hole H are processed, the hole H that reaches the substrate 1 can be formed. Moreover, in each first processing according to the first embodiment, the metal mask layer can be formed after the formation of an inclined surface in the hole H.

Thus, according to the first embodiment, by configuring a mask layer with the foundation mask layer 5 and the metal mask layer, the mask layer having the hole H which is prevented from having a taper shape and being blocked can be easily formed, and therefore a suitable mask layer can be provided with ease. According to the first embodiment, by forming an inclined surface in the hole H with a high aspect ratio, a metal mask layer can be formed without blockage of the hole H and therefore the metal mask layer can be formed without being processed.

Second Embodiment

FIG. 5A to FIG. 5C and FIG. 6A to FIG. 6C are sectional views depicting a method for producing a semiconductor device according to a second embodiment.

Figure 5A:
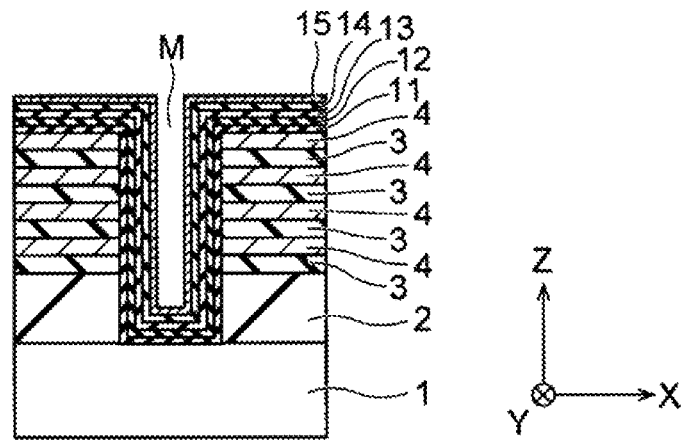
FIG. 5A to FIG. 5C are sectional views (1/2) depicting a method for producing a semiconductor device according to a second embodiment.

First, a foundation layer 2 is formed on a substrate 1, a plurality of insulating layers 3 and a plurality of electrode layers 4 are alternately formed on the foundation layer 2, and a hole M that passes through these electrode layers 4, insulating layers 3, and foundation layer 2 is formed (FIG. 5A). The above processing can be executed by the processes of FIG. 1A to FIG. 3C, for example. The foundation layer 2, the insulating layers 3, and the electrode layers 4 are examples of the first film. The hole M is an example of the recess. The hole M according to the second embodiment may be used as a memory hole for a three-dimensional memory.

Next, referring to FIG. 5A, on the entire surface of the substrate 1, a first block insulating film 11, a second block insulating film 12, a charge-storage layer 13, a tunnel insulating film 14, and a first channel semiconductor layer 15 of the three-dimensional memory are formed in this order. As a result, these layers (11 to 15) are formed on the side face and the bottom face of the hole M. These layers are examples of the first layer. The first block insulating film 11 may be a high-k film (e.g., having a high dielectric constant k), for example. The second block insulating film 12 may be a $SiO_2$ film, for example. The charge-storage layer 13 may be a SiN film, for example. The tunnel insulating film 14 may be a $SiO_2$ film, for example. The first channel semiconductor layer 15 may be a Si film, for example.

Figure 5B:
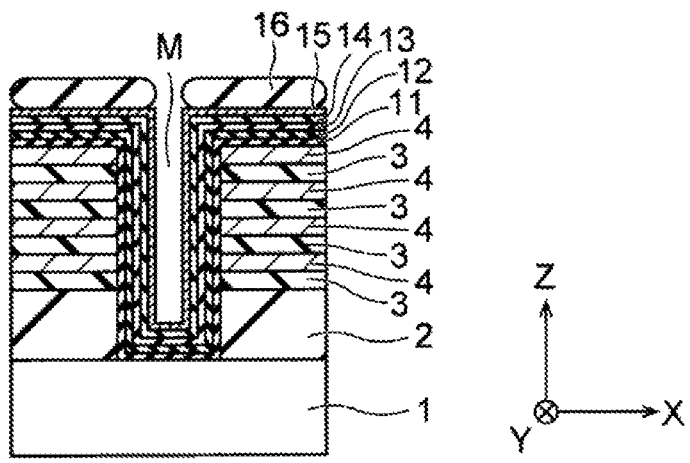

Next, referring to FIG. 5B, on the stacked film including the insulating layers 3 and the electrode layers 4, a foundation mask layer 16 is formed with the layers (11 to 15) placed between the stacked film and the foundation mask layer 16. The foundation mask layer 16 is an example of the second film. As in the case of the above-described foundation mask layer 5, the foundation mask layer 16 of the second embodiment may be a nonmetal mask layer that does not contain a metallic element and is a $SiO_2$ film, for instance.

The foundation mask layer 16 according to the second embodiment may be formed by CVD in a non-conformal manner in such a way as to form the side face of the hole M with the first channel semiconductor layer 15. As a result, the foundation mask layer 16 can be selectively formed on the upper surface of the above-described stacked film. In the second embodiment, the opening width of the hole M after the process of FIG. 5B may be approximately equal to or slightly smaller than the opening width of the hole M after the process of FIG. 5A.

Figure 5C:
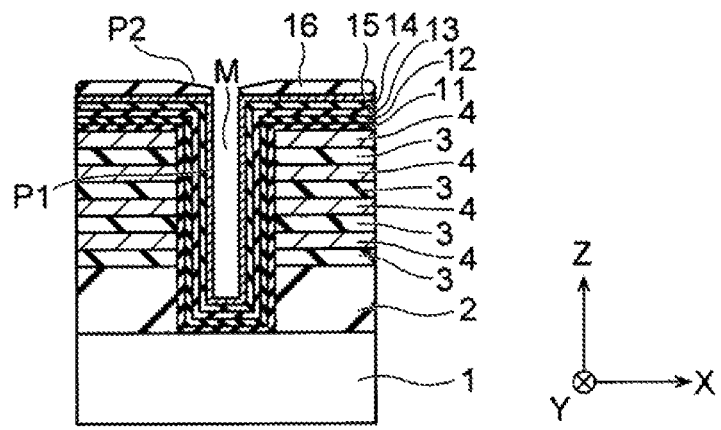

Next, referring to FIG. 5C, by processing the hole M formed by the time the process of FIG. 5C is executed, an inclined surface P2 inclined with respect to a side face P1 of the hole M is formed above the side face P1 of the hole M. This process can be executed in a manner similar to the process of FIG. 2A. By this process, the inclined surface P2 of the foundation mask layer 16 may be formed between the side face P1 of the hole M (e.g., a side face of the first channel semiconductor layer 15 and the foundation mask layer 16) and the upper surface of the foundation mask layer 16.

Figure 6A:
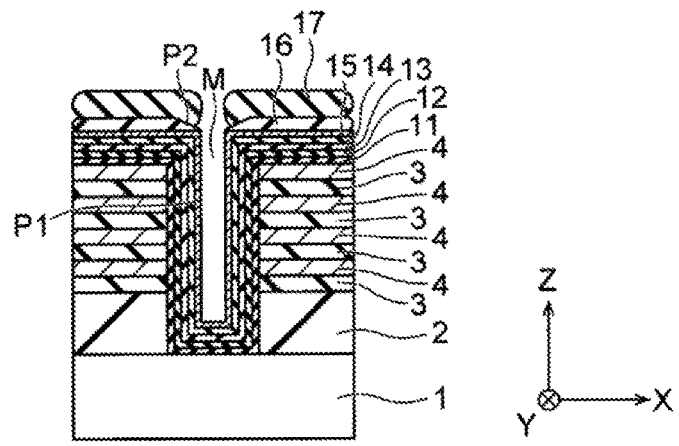
FIG. 6A to FIG. 6C are sectional views (2/2) depicting the method for producing a semiconductor device according to the second embodiment.

Next, referring to FIG. 6A, a metal mask layer 17 is formed on the foundation mask layer 16. This process can be executed in a manner similar to the process of FIG. 2B. As in the case of the above-described metal mask layer 7, the metal mask layer 17 may be a mask layer containing a metallic element and is an $Al_2O_3$ film, for example. The metal mask layer 17 is an example of the third film, and aluminum in the metal mask layer 17 is an example of the first metallic element. As in the case of the metal mask layers 7 and 8, the metal mask layer 17 may be a $Y_2O_3$ film or an Al film.

The foundation mask layer 16 according to the second embodiment may be formed by PVD in a non-conformal manner in such a way as to form the side face P1 of the hole M with the first channel semiconductor layer 15 and the foundation mask layer 16. As a result, the metal mask layer 17 can be selectively formed on the upper surface and the inclined surface P2 of the foundation mask layer 16. The metal mask layer 17 according to the second embodiment may be formed so that the opening width of the hole M after the process of FIG. 6A becomes approximately equal to the opening width of the hole M after the process of FIG. 5B. The processes of FIG. 5C and FIG. 6A correspond to the 1st first processing.

Figure 6B:
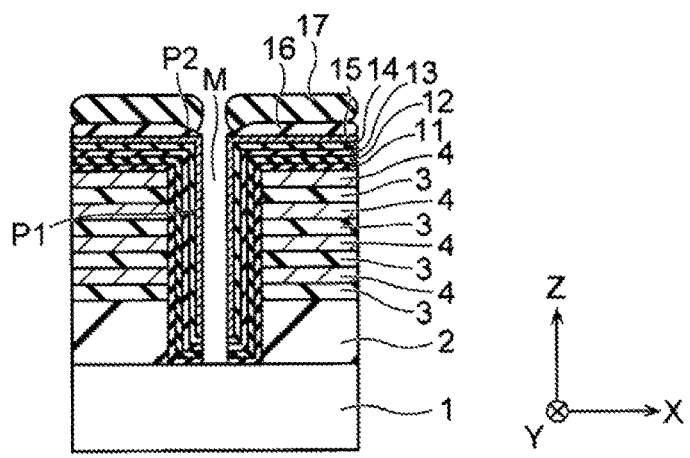

Next, referring to FIG. 6B, the first channel semiconductor layer 15, the tunnel insulating film 14, the charge-storage layer 13, the second block insulating film 12, and the first block insulating film 11 on the bottom of the hole M are processed by RIE using the metal mask layer 17, the foundation mask layer 16, and so forth as a mask. As a result, the hole M can pass through these layers (11 to 15) and reaches the substrate 1. The process of FIG. 6B corresponds to the 1st second processing.

If the hole M becomes thin before reaching the substrate 1, the 2nd and subsequent first processing and second processing maybe executed. That is, processes similar to the processes of FIG. 5C to FIG. 6B may be executed again.

Figure 6C:
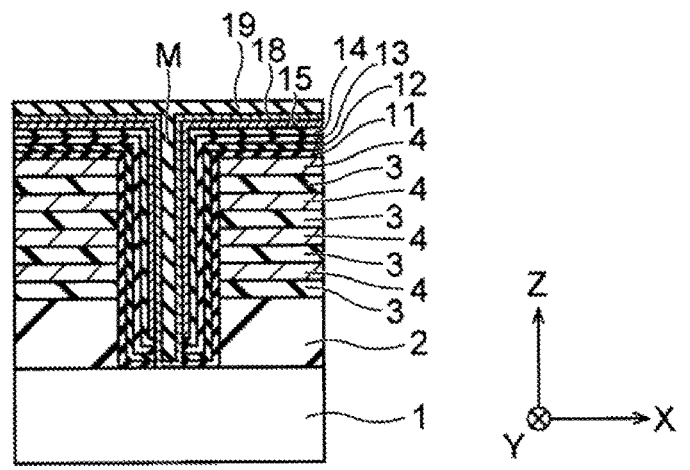

Next, referring to FIG. 6C, after the metal mask layer 17 and the foundation mask layer 16 are removed, a second channel semiconductor layer 18 and a core insulating film 19 of the three-dimensional memory are formed in this order on the entire surface of the substrate 1. As a result, the second channel semiconductor layer 18 is formed on the side face and the bottom face of the hole M, and the core insulating film 19 is embedded in the hole M. The second channel semiconductor layer 18 and the core insulating film 19 are examples of the second layer. The second channel semiconductor layer 18 is a Si film, for example. The core insulating film 19 is a $SiO_2$ film, for example.

In this way, a memory cell structure of the three-dimensional memory can be formed. The above-described first block insulating film 11, second block insulating film 12, charge-storage layer 13, tunnel insulating film 14, first channel semiconductor layer 15, second channel semiconductor layer 18, and core insulating film 19 on the stacked film may be then removed.

In the second embodiment, in place of forming the stacked film alternately including the plurality of insulating layers 3 and the plurality of electrode layers 4, a stacked film alternately including a plurality of first insulating layers (e.g., insulating layers 3) and a plurality of second insulating layers (e.g., sacrificial layers—not shown) may be formed. The first insulating layer is a $SiO_2$ film, for instance. The second insulating layer is a SiN film, for instance. In this case, as the metal mask layer 17, a tungsten (W) film can be used. Each second insulating layer may be removed by etching in a predetermined stage, and the electrode layer 4 may be embedded in a cavity formed by the removal of each second insulating layer.

As described above, in the second embodiment, by executing the first processing by which the metal mask layer 17 is formed on the foundation mask layer 16 and the second processing by which the first channel semiconductor layer 15, the tunnel insulating film 14, the charge-storage layer 13, the second block insulating film 12, and the first block insulating film 11 on the bottom of the hole M are processed, the hole M that passes through these layers (11 to 15) is formed. Moreover, in the first processing according to the second embodiment, the metal mask layer 17 is formed after the inclined surface P2 is formed in the hole M.

Thus, according to the second embodiment, by configuring a mask layer with the foundation mask layer 16 and the metal mask layer 17, the mask layer having the hole M which is prevented from having a taper shape and being blocked can be easily formed, and therefore a suitable mask layer can be provided with ease. According to the second embodiment, by forming an inclined surface in the hole M with a high aspect ratio, a metal mask layer can be formed without blockage of the hole M and therefore the metal mask layer can be formed without being processed.

While certain embodiments have been described, these embodiments have been presented byway of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A method for producing a semiconductor device, the method comprising:
   forming a first film on a substrate;
   forming a second film on the first film;
   forming a recess in the second film;
   executing, one or more times, first processing by which a third film is formed on the second film to form a side face of the recess with the second film and second processing by which the first film exposed in the recess is processed by using the second and third films; and
   in relation to an N-th (N is an integer greater than or equal to 1) first processing, before the third film is formed on the second film, forming a surface inclined with respect to the side face of the recess, the surface being formed above the side face of the recess.

2. The method according to claim 1, wherein by alternately and repeatedly executing the first processing and the second processing, the first film is processed such that the recess passes through the first film.

3. The method according to claim 1, wherein the surface is formed by processing the recess by dry etching.

4. The method according to claim 1, wherein the third film contains a metallic element.

5. The method according to claim 1, wherein
   the first film includes a plurality of insulating layers and a plurality of electrode layers which are alternately formed on the substrate,
   the third film contains a first metallic element,
   the insulating layers contain silicon, and
   the electrode layers contain a second metallic element, which is different from the first metallic element, or silicon.

6. The method according to claim 1, wherein
   the first film includes a plurality of first insulating layers and a plurality of second insulating layers, which are alternately formed on the substrate,
   the third film contains a metallic element, and
   the first insulating layers and the second insulating layers contain silicon.

7. The method according to claim 1, wherein
   the third film is formed such that a recess formed in the third film has the same opening width as an opening width of the recess formed in the second film.

8. A method for producing a semiconductor device, the method comprising:
   forming a first film on a substrate;
   forming a recess in the first film;
   forming a first layer on a side face and a bottom face of the recess;
   forming a second film on the first film to form the side face of the recess with the first layer;
   executing, one or more times, first processing by which a third film is formed on the second film to form the side face of the recess with the first layer and the second film and second processing by which the first layer on the bottom of the recess is processed by using the second and third films; and
   in relation to an N-th (N is an integer greater than or equal to 1) first processing, before the third film is formed on the second film, forming a surface inclined with respect to the side face of the recess, the surface being above the side face of the recess.

9. The method according to claim 8, further comprising:
   forming a second layer in the recess after processing the first layer.

10. The method according to claim 9, wherein
    the first layer includes at least a charge-storage layer and a first semiconductor layer, and
    the second layer includes at least a second semiconductor layer.

11. The method according to claim 8, wherein
    the first film includes a plurality of insulating layers and a plurality of electrode layers which are alternately formed on the substrate,
    the third film contains a first metallic element,
    the insulating layers contain silicon, and
    the electrode layers contain a second metallic element, which is different from the first metallic element, or silicon.

12. The method according to claim 8, wherein
    the first film includes a plurality of first insulating layers and a plurality of second insulating layers, which are alternately formed on the substrate,
    the third film contains a metallic element, and
    the first insulating layers and the second insulating layers contain silicon.

13. The method according to claim 8, wherein
    the first layer includes a charge-storage layer and a first semiconductor layer.

14. The method according to claim 8, wherein
    the first layer further includes a first block insulating film and a tunnel insulating film.

15. A method for producing a semiconductor device, the method comprising:
    forming a first film on a substrate;
    forming a second film on the first film;
    forming a recess in the second film, a side surface of the second film being exposed in the recess;
    processing an upper portion of the side surface of the second film to form an inclined surface which is inclined with respect to the side face of the second film;
    forming a third film on the inclined surface of the second film; and
    processing the first film by using the second film and the third film as a mask.

* * * * *